United States Patent [19]

Bynum

[11] 4,245,353
[45] Jan. 13, 1981

[54] AMPLITUDE TILT CORRECTION APPARATUS

[75] Inventor: Brian T. Bynum, Dallas, Tex.

[73] Assignee: Rockwell International Corporation, El Segundo, Calif.

[21] Appl. No.: 4,091

[22] Filed: Jan. 17, 1979

[51] Int. Cl.³ .................. H04B 1/12; H03H 21/00
[52] U.S. Cl. .................... 455/234; 333/18; 455/266; 455/307; 455/311
[58] Field of Search ............. 325/399, 400, 404, 405, 325/408, 409, 411, 427, 473, 477, 479; 333/17 R, 18; 455/232–234, 239, 245, 266, 296, 307, 295, 311, 246

[56] References Cited

U.S. PATENT DOCUMENTS

| 2,501,330 | 3/1950 | Hammond, Jr. | 325/404 |
| 2,550,596 | 4/1951 | Pfleger | 333/18 |
| 2,626,993 | 1/1953 | Wright et al. | 333/18 |
| 2,719,270 | 9/1955 | Ketchledge | 333/18 |

FOREIGN PATENT DOCUMENTS 2374784  7/1978  France .................... 325/477

Primary Examiner—Marc E. Bookbinder
Attorney, Agent, or Firm—Bruce C. Lutz; Howard R. Greenberg; H. Fredrick Hamann

[57] ABSTRACT

Circuitry for detecting the spectral distribution of a signal that is phase indicative of a digital logic level and providing feedback signals for use in adjusting the signal amplitude of the spectrum to have a substantially zero slope over the relevant frequency bandwidth. The correction is obtained by applying voltages to variable impedance pin diodes forming part of a tuned filter circuit.

6 Claims, 7 Drawing Figures

AMPLITUDE TILT CORRECTION APPARATUS

THE INVENTION

The present invention is generally related to electronics and more specifically related to transmission and reception of alternating waveform variable phase signals indicative of digital logic levels.

It is known in the prior art that multipath interference can cause a notch in the envelope of the spectra of received signals as detected in a microwave receiver if the interfering signal is 180 degrees out-of-phase with respect to the incident signal. A multipath condition can also cause the envelope amplitude of signals in a given RF spectrum used to transmit the information to tilt in the microwave receiver if the interfering signal is at a phase angle, with respect to the incident signal, which is some value other than 180 degrees. For conditions to be corrected by one embodiment of the invention, the relating phase angle must be outside the range of 180°±25°.

It has also been determined that whenever the envelope amplitude of the signals comprising the RF spectrum under consideration as received by a digital radio is tilted, the tilt causes a degradation in the bit error rate performance of the radio receiver system. In fact, the bit error rate (BER) performance degrades very rapidly as the signal amplitude of the received spectrum of signals is tilted. Although it might be assumed that limiting the amplitude of the signals would correct the problem, it has been determined that such limiters degrade the bit error rate performance even more. Limiters cannot correct the distortion of the waveform zero crossings which are displaced by the spectrum amplitude tilt.

Some of the above determinations as well as general information on the effective selective fading on digital ratio receiver performance is outlined in a paper given by Bell-Northern Research of Ottawa, Canada, and authored by C. W. Anderson, et al., entitled, "The effect of Selective Fading on Digital Radio". This paper may be found in the 1978 *IEEE International Communications Conference* and presented on pages 33.5.1 through 33.5.6 in the conference report. While this article indicates that adaptive linear amplitude equalizing is necessary to combat multipath interference, no indication is provided therein as to how such might be accomplished. The present invention solves that problem of accurate detection of information contained in signals having amplitude tilt due to multipath interference, but does not address or attempt to solve the problem of a "notch" in the envelope of the received signal spectrum. The notch problem is, however, addressed and solved in a copending application Ser. No. 004,090 filed on even date herewith.

Since the subject matter of the present invention was to operate in a radio in the gigahertz region, the present circuit was designed to be used in the IF stage immediately after the input signal was mixed with a local oscillator and prior to being demodulated. In operation, the signal obtained from the local oscillator is passed through a series circuit comprising a bandpass filter, one or more tuned filter circuits and an automatic gain control circuit before being applied to the demodulator section. The order of connection of these last three mentioned components may be interchanged in accordance with the design objectives of the scheme. In a preferred embodiment a bandpass filter was used first and then signals were passed through both an out-of-band low frequency tuned circuit and an out-of-band high frequency tuned circuit before being applied to an automatic gain control circuit. This signal was then output to the demodulator. The signal going to the demodulator was also returned through a frequency sensitive detection circuit for determining the amplitude of signals at the middle of the desired band of frequencies. In one embodiment of the invention the desired band of frequencies was between 60 and 80 megahertz and the detected frequency was 70 megahertz. After detection, this signal was used to control the automatic gain control (AGC) circuit to maintain the average amplitude over the band at a given value. The signal applied to the demodulator was also applied through two other frequency sensitive circuits at the edge of the band of desired frequencies. In other words, these two filters passed signals at 60 and 80 megahertz. The output signals from these detector circuits would then indicate the amplitude of signal components at that frequency. Comparators were then used to compare the amplitude of the signal at the middle of the range or band of frequencies with that at each of the edges and used to control the Q of the previously mentioned out-of-band low and high frequency filters. These filters were in actuality a load on a transistor amplifier and the variation in Q affected the loading of the amplifiers so as to vary the gain.

By introducing a fixed negative amplitude tilt into the received signal spectrum and thus requiring the tank circuit Q to be at mid-range to achieve a flat overall system response, only one out-of-band tuned circuit need be used with a resultant reduction in the amount of detection circuitry. Thus, it is within the scope of the present invention to use such a single tuned circuit by increasing or decreasing the tank circuit Q (and thus the response slope) from the midrange value.

The above concept will operate at any frequency and the only limitation is state of the art components necessary to implement the function.

It is therefore an object of the present invention to provide amplitude tilt compensation for an alternating signal over a given range of frequencies.

Another object of the present invention is to reduce multipath interference effects on received signals as they relate to causation of bit error rate performance degradation in digital radio receivers.

Other objects and advantages of the present invention may be ascertained from a reading of the specification and appended claims in conjunction with the drawings wherein:

DETAILED DESCRIPTION

Figure 1:
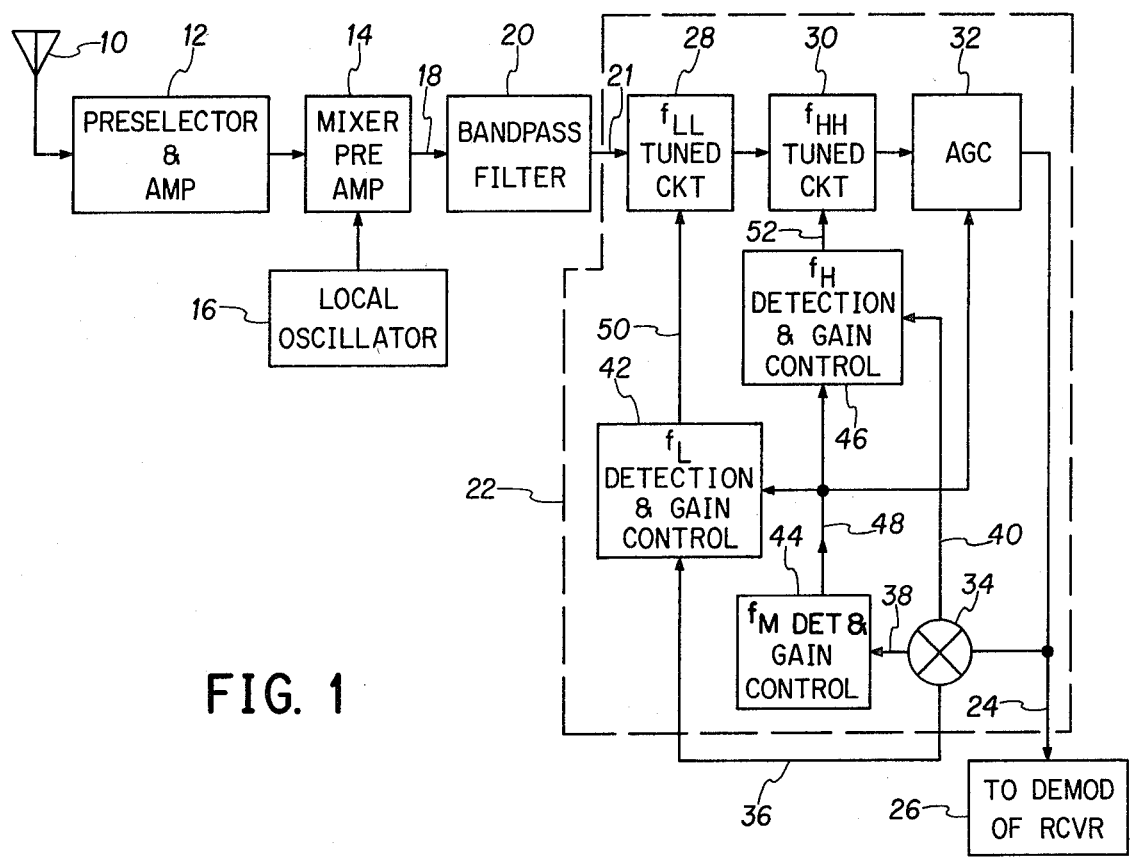
FIG. 1 is a block diagram of the overall invention concept as utilized in a digital radio receiver.

In FIG. 1 an antenna 10 supplies signals to a preselector and amplifier block 12 which provides output signals to a mixer preamp block 14. The miser 14 also receives signals from a local oscillator 16 which results in an IF signal, which in one embodiment of the invention was centered about 70 megahertz, being supplied on a lead 18 to a bandpass filter 20. Bandpass filter 20 supplies signals to a dash line block 22 which comprises the subject matter of the invention. Block 22 supplies signals on output lead 24 to a demodulator section of a radio receiver 26. Within block 22 and receiving signals from the bandpass filter 20 is a $f_{LL}$ tuned circuit 28. Tuned circuit 28 supplies signals to a $f_{HH}$ tuned circuit 30. Each of the tuned circuits 28 and 30 have control signal inputs for varying the Q of the tuned circuits. The output of block 30 is supplied through an AGC block 32 to the output 24. Output 24 is also supplied to a signal dividing circuit 34 which supplies signals on leads 36, 38 and 40 to an $f_L$ detection and gain control circuit 42, an $f_M$ detection and gain control circuit 44 and an $f_H$ detection and gain control circuit 46, respectively. An output signal from $f_M$ detection and gain control circuit 44 supplies an output signal on a lead 48 to provide gain control information to AGC circuit 32 and to provide reference signal inputs to blocks 42 and 46. The block 42 has an output on lead 50 to provide control signals to control the Q of tuned circuit 28 while the gain control block 46 provides output signals on lead 52 to control the Q of tuned circuit 30.

Figure 2:
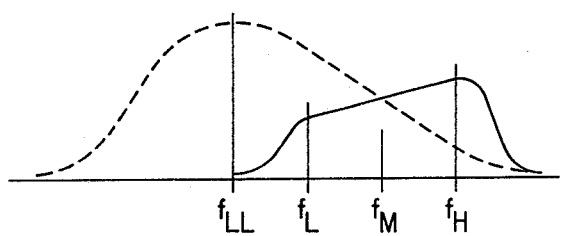
FIG. 2 illustrates waveforms indicative of the impedance of a tuned circuit and of the envelope of signals received by the correction circuit and their relative values at various frequencies.

In FIG. 2 there is shown a waveform in solid lines which extends on the left-most portion to a reference line indicating zero amplitude. It then extends towards the right and rises to a fairly linear portion at $f_L$ which is the low side of a band of signals. In one embodiment of the invention this low side was 60 megahertz. The waveform then extends through an $f_M$ and $f_H$ portion on a fairly linear basis, except that it is sloped in the positive direction. In one embodiment of the invention frequency $f_M$ was 70 megahertz and frequency $f_H$ was 80 megahertz. After the $f_H$ frequency, the waveform begins to drop towards the zero amplitude reference level. The dash line waveform represents the amplitude of signals produced by a tuned circuit such as 28 over a range of frequencies. This tuned circuit is tuned to a frequency $f_{LL}$ which is outside the band of frequencies to be passed by the bandpass filter 20. However, the tuned circuit acts as a frequency selective impedance to frequencies other than $f_{LL}$ and thus provides a lower impedance (in actuality the amplifier within the circuit provides more gain) or less resistance to the passing of signals of the frequency $f_L$ than it does to the signals of the frequency $f_H$. Thus, the tuned circuit can be adjusted to a Q value which will provide a frequency selective impedance such that the frequency band of interest from $f_L$ to $f_H$ has a substantially constant value and thus there is no slope.

Figure 3:
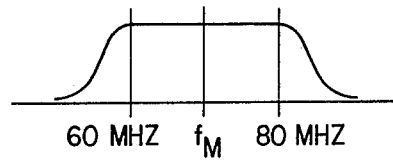
FIG. 3 illustrates the envelope of a signal corrected in accordance with this invention after being received in the form shown in FIG. 2.

The waveform of FIG. 3 illustrates the envelope of the signals when the Q of block 28 is adjusted properly for a positive slope incoming signal.

Figure 4:
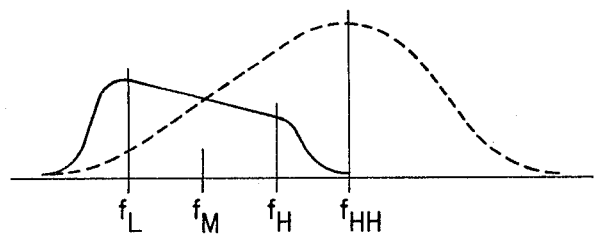
FIG. 4 is illustrative of signal amplitude tilt in the direction opposite that shown in FIG. 2 and further illustrative of the compensating impedance used to correct the distortion.

FIG. 4 illustrates the waveform of an incoming signal which has a negative tilt due to multipath distortion and as illustrated the $f_{HH}$ tuned circuit is adjusted to a value such that its high impedance at $f_L$ and its somewhat lower impedance at $f_H$ causes the resultant frequency spectrum of interest to be the same amplitude throughout the frequency band and thus the output signal supplied to AGC circuit 32 is again of a form shown in FIG. 3.

Figure 5:
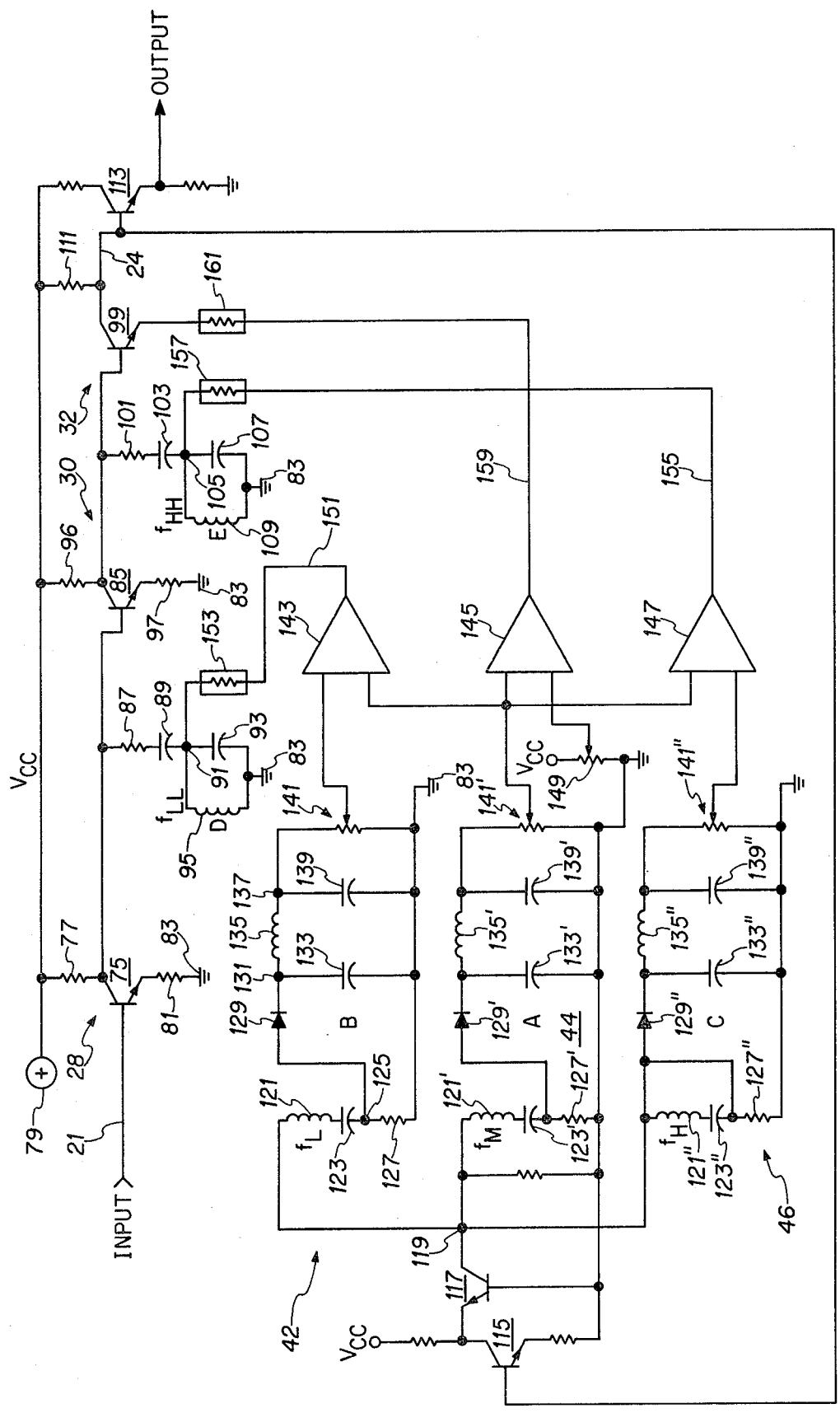
FIG. 5 is a detailed schematic diagram of the amplitude tilt correction portion of FIG. 1.

In FIG. 5 an input 21 is shown which corresponds to that of FIG. 1 and supplies signals to an $f_{LL}$ tuned circuit designated generally as 28 and having an NPN transistor 75 which has its collector connected through a resistor 77 to a positive power terminal 79. The emitter of transistor 75 is connected through a resistor 81 to ground 83. The collector of transistor 75 is also connected to the base of an NPN transistor 85 and through a resistor 87 and a capacitor 89 to a junction point 91. A capacitor 93 and an inductance 95 are connected in parallel between junction point 91 and ground 83. Transistor 85 has its collector connected through a resistor 96 to positive terminal 79 and its emitter connected through a resistor 96 to ground 83. Transistor 85 is part of the $f_{HH}$ tuned circuit 30. The collector of transistor 85 is connected to the base of an NPN transistor generally designated as 99 and comprising part of an AGC circuit 32. The collector of transistor 85 is also connected through a resistor 101 and a capacitor 103 to a junction point 105. A capacitor 107 and an inductance 109 are connected in parallel between junction point 105 and ground 83. The collector of transistor 99 is connected through a resistor 111 to positive potential 79. The collector is also connected to a lead 24 supplying signals to an isolation amplifier 113 which provides signals to the demodulator 26. The lead 24 also supplies signals to an NPN transistor 115 which is connected to a common base connected NPN transistor 117. Transistors 115 and 117 provide isolation between the AGC circuit and a plurality of gain control circuits previously designated as 42, 46 and 44. As illustrated, the output of transistor 117 is connected to provide signals from a junction point 119 through an inductance 121 and a capacitor 123 to a junction point 125. Junction point 125 is connected through a resistor 127 to ground 83 and also connected through a diode 129 to a junction point 131. A capacitor 133 is connected between junction point 131 and ground 83. An inductance 135 is connected between junction point 131 and a junction point 137. A capacitor 139 and a potentiometer 141 are connected in parallel between junction point 137 and ground 83 and a wiper of potentiometer 141 is connected to supply a first input signal to a comparator amplifier 143. The circuit 42 is essentially a tuned circuit and primarily passes the signals of frequency $f_L$, rectifies these signals and provides a DC output signal from the wiper of potentiometer 141 indicative of the amplitude of the signals at frequency $f_L$. The circuit 44 is substantially identical and the components thereof are given identical primed numbers to that given for block 42. The wiper output of potentiometer 141' is connected to supply an input signal to a comparator amplifier 145 as well as to supply reference input signals to the previously mentioned comparator 143 and to a comparator amplifier 147. A second input of amplifier 145 is supplied from a reference potential source represented by potentiometer 149. Again, gain control block 44 primarily passes the signals having a frequency of $f_M$ and provides as an output on potentiometer 141' a direct voltage signal indicative of the amplitude of the signals having a frequency $f_M$. Finally, a frequency selective tuned circuit for use as a gain control circuit 46 is shown having double primed numbers designating the components identical to that in block 42. Thus, the circuit 46 passes the signals having a frequency of $f_H$ and provides an output on the wiper of potentiometer 141'' indicative of the amplitude of signals occurring at that frequency, thereby providing a second input signal to comparator 147. An output of $f_L$ comparator 143 provides signals on a lead 151 to control a variable impedance within variable gain block 153. In one embodiment of this invention the block 153 comprises pin diodes which vary in resistance in accordance with the voltage placed thereacross. The comparator 147 supplies signals on a lead 155 to a similar variable impedance device 157 which also may be one or more pin diodes which vary in resistance in accordance with the voltage thereacross. Finally, comparator 145 supplies signals on a lead 159 to a variable impedance device 161. The variation in impedance in the emitter resistor for transistor 99 will vary the gain and provide an automatic gain control function while the variation of impedance of resistors 153 and 157 will vary the Q of the filtering circuits $f_{LL}$ and $f_{HH}$ in accordance with the voltage supplied thereto and thus vary the load impedance on the associated transistors.

Figure 6:
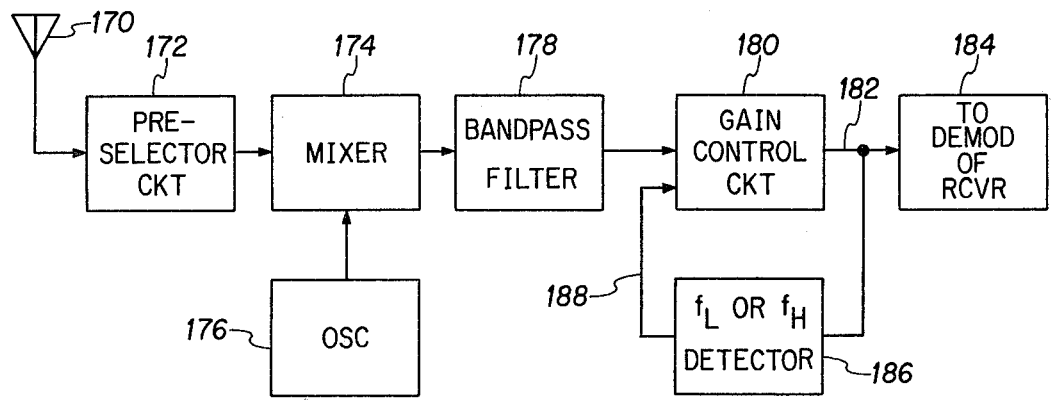
FIG. 6 is a block diagram illustrating the form of the invention if the distortion is known to cause only one polarity of slope or it may provide correction in both directions by designing the circuit response to be flat with circuit Q at midrange.

In FIG. 6 an antenna 170 supplies signals to a preselector and amplifier circuit 172 which supplies signals to a mixer circuit 174 and receives local oscillator signals from an oscillator block 176. An IF output is supplied to a bandpass filter 178 which removes signals of all frequencies other than the frequency band of interest. This band of frequencies is then supplied to a gain control circuit 180 for amplitude correction before being supplied on lead 182 to the demodulator of the receiver 184. Lead 182 is also connected to a detector 186 which may be either an $f_L$ or an $f_H$ detector which supplies output signals on a lead 188 to the gain control circuit 180. The circuit of FIG. 6 is usable where the multipath distortion is such that the slope of the received signal is either always positive or always negative. If the slope is always positive, the detector 186 would be an $f_L$ detector and if the slope is always negative, the detector 186 would always be an $f_H$ detector. In either event, only the one detector is required to correct the slope of the bandpass signal toward a zero slope condition.

Figure 7:
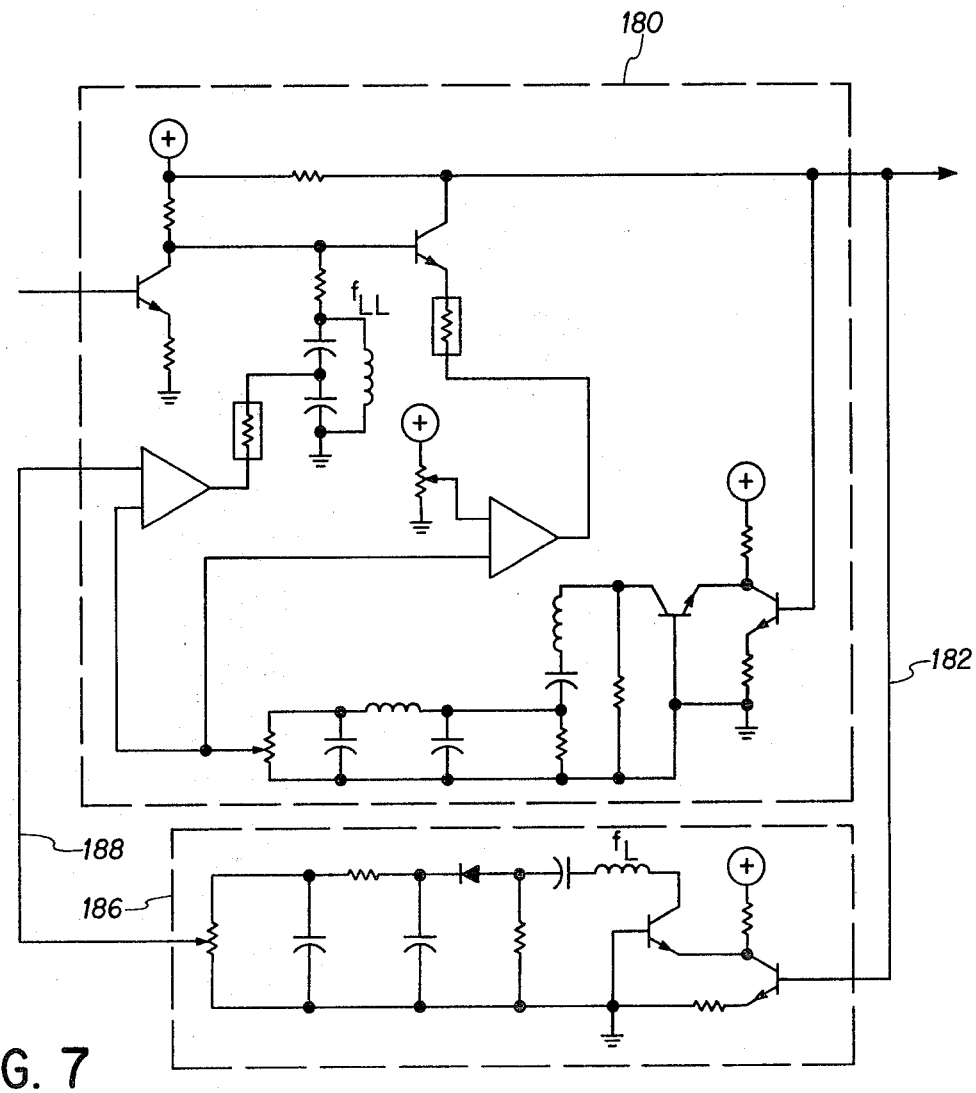
FIG. 7 illustrates a detailed schematic diagram of a circuit usable in the block diagram of FIG. 6.

In FIG. 7 a more detailed presentation is provided of the blocks 180 and 186. Since the circuitry in these blocks is substantially identical to that illustrated in conjunction with FIG. 6, no further descriptive information is deemed necessary.

OPERATION

Since linear slope does not contribute to cross-modulation in an FM system, a linear slope component is tolerable in system operation. However, the same linear slope component completely destroys the intelligibility of digital systems when the slope exceeds 4 dB across the signal bandwidth. As is known, FM systems are presently being replaced by digital systems for voice communications.

Although linear slope introduced by the equipment itself can be compensated for on installation, linear slope is also caused by the reception of two microwave signals, identical except in arrival time. This distortion to the linear slope is produced by multipath propagation of microwave signals. Such distortion can be satisfactorily compensated only by automatic methods, since they vary considerably over fairly short periods of time. As will be realized, not only does the relative arrival time of the two signals change but their relative amplitudes change also. Thus, the amplitude distorting characteristic varies considerably with time.

It has been found that the amplitude distortion in volts and delay distortion in seconds occurs in accordance with formulas (1) and (2) below.

$$\text{Amplitude Distortion} = \sqrt{(1 + A^2) + 2A \cos(\omega t)} \tag{1}$$

$$\text{Delay Distortion} = \frac{-T}{2} \left[ \frac{2A^2 + 2A \cos(\omega t)}{1 + A^2 + 2A \cos(\omega t)} \right] \tag{2}$$

where A is a unitless number indicative of the relative amplitude of the two received signals, and T is equal to the relative delay of the two received signals in seconds, and $\omega$ equals $2\pi$ times the frequency of the two received signals.

Although the distortion shapes described above also introduce a parabolic component to the received signal, the effect of this parabolic component is minimized where space diversity receivers are employed. In other words, if a notch occurs in the amplitude of the receive signal in the band of interest due to the fact that the received signals are 180° out-of-phase, the characteristics of this type of distortion are such that only one of the two receivers will have the notch distortion, while the other receiver will experience essentially only slope distortion. It should be emphasized, that this condition of only having to cope with and compensate for slope distortion is normally available only for space diversity systems.

Since the notch type distortion occurs at frequency intervals equal to 1/T, the success of an automatic tilt correction circuit using space diversity receivers will be proportional to [(1/T)/(signal bandwidth)]. Short relative delay times and/or narrow signal bandwidths thus tend to increase the probability that one space diversity receiver will experience only slope distortion which can effectively be detected and compensated by the circuit described in this application. In other words, the digital microwave radio chooses the better of the two received signals in accordance with known detection methods.

Referring first to the $f_{LL}$ tuned circuit 28 of FIG. 5, it will be found that the voltage gain of this stage is:

$$\frac{V_o}{V_{IN}} = \frac{1}{R_{81}} \left[ R_{77} + \frac{R_{153}}{1 + R \frac{153}{J\omega L} (1 - \frac{\omega^2}{\omega L^2})} \right] \tag{3}$$

where $$\omega_L = 2\pi f_L = \frac{1}{\sqrt{L_{95} C_{93}}}$$

with R, L and C having resistance inductance and capacitance values in accordance with the indicated components. Thus the voltage gain of this stage may be changed from no variation with frequency where the resistance of the pin diode or variable resistor 153 is much, much less than the resistance of resistor 77 to a geometrically symmetrical variation with frequency about the frequency $f_L$. Equation (3) thus describes the form of the dash line waveform of FIG. 2.

From the above remarks it may be observed that in FIG. 1 a signal is received on antenna 10, mixed with the local oscillator signal in mixer 14 and filtered in bandpass filter 20 to supply an output in one embodiment of the invention which comprised primarily signal components in the 60 to 80 megahertz range with a center frequency of 70 megahertz. The voltage gain (the voltage gain in circuits 28 and 30 is generally less than 1 unless they include amplification transistors such as 75 and 85) of the circuits 28 and 30 modifies the slope of the signal in the range of 60 to 80 megahertz so that the slope is substantially zero. The AGC circuit 32 then adjusts the gain at the approximate mid-frequency $f_M$ toward a predetermined value so that the demodulator 26 can satisfactorily detect the phase modulation without the cross-modulation components distorting the results and causing errors. The signal that is fed to the demodulator 26 is fed to each of the detection circuits operating at $f_L$, $f_M$ and $f_H$. The outputs of these detection circuits operate the tuned circuits 28 and 30 as well as the AGC circuit 32. The middle frequency circuit 44 uses as a reference a predetermined value while the circuits 42 and 46 use as a reference the output of the circuit 44. Thus, the circuits 42 and 46 are providing an output indicative of the relative values of signal level at the mid-point and each of the extremes of the band of frequencies. By adjusting the gain on both the high and low sides, the passband of signals can be adjusted for either positive or negative slope.

As briefly mentioned, FIG. 6 is usable where the multipath distortion causes slope of only one polarity to occur. The detector 186 would be an $f_L$ detector if the slope were positive and needed to be corrected toward a zero slope. Thus 186 would detect the amplitude of the signal on lead 182 and within block 180 compare it with a reference used to control the gain of block 180 at the center frequency and thus adjust the Q of an $f_{LL}$ tuned circuit within block 180 such that the output signal is forced towards a zero slope condition.

While I have shown two embodiments of the present inventive concept, it is to be realized that the solution can be approached from various other starting points and still use the present inventive concept. Thus, I wish to be limited only by the scope of the appended claims.

I claim:

1. Signal compensation apparatus for use in a radio receiver comprising, in combination:

first signal input means for supplying an input signal which may have amplitude tilt from multipath distortion;

low frequency $f_{LL}$ tuned circuit means including control input means for adjusting the quality factor Q thereof in accordance with control input signals;

high frequency $f_{HH}$ tuned circuit means including control input means for adjusting the quality factor Q thereof in accordance with control input signals;

automatic gain control means (AGC), including gain control input means, for adjusting the gain of signals passing through the AGC means;

first signal output means for supplying a tilt compensated output signal;

means connecting said $f_{LL}$ tuned circuit means, said $f_{HH}$ tuned circuit means and said AGC means between said first signal input means and said first signal output means;

intermediate frequency (fm) detection means connected between said first signal output means and said gain control input means for controlling the amplitude of output signals of the compensation apparatus toward a predetermined level;

$f_H$ frequency detection means, connected between said first signal output means and said control input means of said $f_{HH}$ tuned circuit means, for controlling the Q of said $f_{HH}$ tuned circuit means, the frequency of $f_H$ being between the frequencies $f_{HH}$ and fm; and $f_L$ frequency detection means, connected between said first signal output means and said control input means of said $f_{LL}$ tuned circuit means, for controlling the Q of said $f_{LL}$ tuned circuit means, the frequency of $f_L$ being between the frequencies $f_{LL}$ and fm.

2. Signal level compensation apparatus comprising, in combination:

signal means for supplying signals having a usable range of signal frequencies from $f_L$ to $f_H$ and including an intermediate signal frequency fm;

gain control means, including input means, for adjusting an input signal amplitude thereat toward a predetermined level at the frequency fm;

apparatus output means, connected to said gain control means, for providing first output signals;

detection means, connected to said apparatus output means, for detecting the relative amplitude of the adjusted signal at a frequency other than the frequency fm within the range $f_L$ to $F_H$ and supplying second output signals indicative thereof; and tuned circuit means, connected to said signal means and said detection means for receiving the second output signals and connected to said gain control means, the Q of said tuned circuit means being altered as a function of the received second output signal where maximum Q occurs at a frequency outside the range of $f_L$ to $f_H$ to adjust the slope of the signal being compensated toward zero amplitude variation in the frequency domain, appearing at said apparatus output means.

3. The method of automatically adjusting an incoming signal, the spectrum of which is sloped over a given frequency band in the frequency domain to a signal whose spectrum has substantially zero slope in the same band comprising the steps of:

passing the incoming signal through a variable Q tuned circuit whose cutter frequency is outside the given frequency band;

detecting the amplitude of signal components at a first frequency in said frequency band and providing a first control signal indicative of that amplitude;

detecting the amplitude of signal components at a second frequency in said frequency band and providing a second control signal indicative of that amplitude;

passing the incoming signal through an automatic gain control (AGC) circuit;

adjusting the Q of said tuned circuit in accordance with said first control signal such that the amplitude of each of the signal components of the incoming signal in the given frequency band is substantially identical; and adjusting the gain of said AGC circuit in accordance with said second control signal to change the amplitude of the signal output by said AGC circuit toward a given value.

4. The method of automatically adjusting an incoming signal, the spectrum of which is sloped over a given frequency band in the frequency domain, to a signal whose spectrum has substantially zero slope in the same band comprising the steps of:
passing the incoming signal through a variable Q tuned circuit whose center frequency is outside the given frequency band;
detecting the amplitude of signal components at a predetermined frequency in said frequency band and providing a control signal indicative of that amplitude; and
adjusting the Q of said tuned circuit in accordance with said control signal such that the amplitude of each of the signal components of the incoming signal in the given frequency band is changed toward values which are substantially identical.

5. Apparatus for automatically adjusting an incoming signal, the spectrum of which is sloped over a given frequency band in the frequency domain to a signal whose spectrum has substantially zero slope in the same band comprising in combination:
a variable Q tuned circuit means whose center frequency is outside the given frequency band;
means for supplying an incoming signal to said tuned circuit means;
first means for detecting the amplitude of signal components at a predetermined frequency in said frequency band after the incoming signal has passed through said tuned circuit means and providing a control signal indicative of that amplitude; and
means for supplying the control signal to said tuned circuit for adjusting the Q of said tuned circuit in accordance with said control signal such that the amplitude of each of the signal components of the incoming signal in the given frequency band are adjusted toward values which are substantially identical.

6. Apparatus as claimed in claim 5 comprising, in addition:
second means for detecting the amplitude of signal components at a second frequency in said frequency band and providing a second control signal indicative of that amplitude;
automatic gain control (AGC) means;
means for passing the incoming signal through said AGC circuit before being detected by said first and second means for detecting; and
means for supplying said second control signal to said AGC means for adjusting the gain of said AGC means in accordance with said second control signal to change the amplitude of the signal output by said AGC means toward a given value.

* * * * *

UNITED STATES PATENT AND TRADEMARK OFFICE
CERTIFICATE OF CORRECTION

PATENT NO. : 4,245,353

DATED : January 13, 1981

INVENTOR(S) : Brian T. Bynum

It is certified that error appears in the above-identified patent and that said Letters Patent are hereby corrected as shown below:

Column 3, line 12 replace "miser" with --mixer--.

Column 8, line 50 replace "cutter" with --center--.

Signed and Sealed this

Sixteenth Day of June 1981

[SEAL]

Attest:

RENE D. TEGTMEYER

*Attesting Officer*      *Acting Commissioner of Patents and Trademarks*